(12) United States Patent
Shen et al.

(10) Patent No.: US 9,538,658 B2
(45) Date of Patent: *Jan. 3, 2017

(54) COMPACT LOW LOSS TRANSITION WITH AN INTEGRATED COUPLER

(71) Applicant: ZTE (USA) Inc., Richardson, TX (US)

(72) Inventors: Ying Shen, Chapel Hill, NC (US); Peng Gao, Xi'an (CN)

(73) Assignee: ZTE (USA) INC., Richardson, TX (US)

( * ) Notice: Subject to any disclaimer, the term of this patent is extended or adjusted under 35 U.S.C. 154(b) by 418 days.

This patent is subject to a terminal disclaimer.

(21) Appl. No.: 13/944,764

(22) Filed: Jul. 17, 2013

(65) Prior Publication Data

US 2014/0022742 A1    Jan. 23, 2014

Related U.S. Application Data

(60) Provisional application No. 61/673,161, filed on Jul. 18, 2012.

(51) Int. Cl.
*H05K 1/18* (2006.01)
*H05K 1/02* (2006.01)
*H01P 5/107* (2006.01)

(52) U.S. Cl.
CPC ............... *H05K 1/18* (2013.01); *H01P 5/107* (2013.01); *H05K 1/0239* (2013.01); *H05K 1/025* (2013.01); *H05K 2201/0969* (2013.01); *H05K 2201/09618* (2013.01); *H05K 2201/10098* (2013.01)

(58) Field of Classification Search
None
See application file for complete search history.

(56) References Cited

U.S. PATENT DOCUMENTS

| | | | | |
|---|---|---|---|---|
| 4,595,890 A | * | 6/1986 | Cloutier | H01P 1/161 333/103 |
| 6,967,543 B2 | * | 11/2005 | Ammar | H01P 5/103 333/125 |
| 7,456,789 B1 | * | 11/2008 | Mason | H01Q 1/02 343/700 MS |
| 2010/0225410 A1 | * | 9/2010 | Margomenos | H01P 5/107 333/26 |
| 2010/0231332 A1 | * | 9/2010 | Sugimoto | H01P 5/107 333/254 |

* cited by examiner

*Primary Examiner* — Paresh Patel
(74) *Attorney, Agent, or Firm* — Morgan, Lewis & Bockius LLP

(57) ABSTRACT

A compact transition structure includes a printed circuit board, wherein there is a rectangular region on one side of the printed circuit board and the rectangular region has a pair of long edges and a pair of short edges; a transition probe on the one side of the printed circuit board, wherein the transition probe extends into the rectangular region through a long edge of the rectangular region and has a terminal near a center of the rectangular region; and a coupler probe on the one side the printed circuit board, wherein the coupler probe extends into the rectangular region through a short edge of the rectangular region and has a terminal before the center of the rectangular region such that the coupler probe is electrically insulated from the transition probe.

13 Claims, 7 Drawing Sheets

COMPACT LOW LOSS TRANSITION WITH AN INTEGRATED COUPLER

RELATED APPLICATION

This application claims priority to U.S. Provisional Patent Application No. 61/673,161, entitled "A Compact Low Loss Transition with an Integrated Coupler," filed Jul. 18, 2012, which is incorporated by reference in its entirety.

TECHNICAL FIELD

The present invention generally relates to wireless telecommunication equipment, and in particular, to a compact low-loss transition with an integrated coupler.

BACKGROUND

Modern microwave transmitter generally requires an accurate control of the radio frequency (RF) transmit power. In the wireless applications, automatic power level control, dynamic power control over various distances and accurate power level control to avoid excessive power to adjacent cells are a few examples of the importance of accurate power controls. At the microwave and millimeter wave bands, the power is also more expensive than the power at lower RF bands. These requirements suggest a need for an optimized design of a transition structure.

SUMMARY

In accordance with some embodiments, a compact transition structure includes a printed circuit board, wherein there is a rectangular region on one side of the printed circuit board and the rectangular region has a pair of long edges and a pair of short edges; a transition probe on the one side of the printed circuit board, wherein the transition probe extends into the rectangular region through a long edge of the rectangular region and has a terminal near a center of the rectangular region; and a coupler probe on the one side the printed circuit board, wherein the coupler probe extends into the rectangular region through a short edge of the rectangular region and has a terminal before the center of the rectangular region such that the coupler probe is electrically insulated from the transition probe.

In accordance with some embodiments, the terminal of the coupler probe has a shape selected from the group consisting of rectangle, fan, ring, and stub.

In accordance with some embodiments, the rectangular region on the one side of the printed circuit board is devoid of metal layer.

In accordance with some embodiments, the rectangular region on the one side of the printed circuit board has four rounded corners.

In accordance with some embodiments, the rectangular region on the one side of the printed circuit board is surrounded by a plurality of metal-plated through-hole vias.

In accordance with some embodiments, the rectangular region on the one side of the printed circuit board is surrounded by a plurality of metal-plated slots.

In accordance with some embodiments, the rectangular region on the one side of the printed circuit board is configured to be coupled to a waveguide.

In accordance with some embodiments, a return loss between the transition probe and the waveguide is less than −20 dB within a wide microwave frequency range.

In accordance with some embodiments, the terminal of the transition probe is coupled to an internal of the waveguide through an electric field.

In accordance with some embodiments, the terminal of the coupler probe is coupled to an internal of the waveguide through a magnetic field.

In accordance with some embodiments, the transition probe is electrically connected to a power amplifier.

In accordance with some embodiments, there is no coupler between the transition probe and the power amplifier.

In accordance with some embodiments, the coupler probe is electrically connected to a diode that converts an alternating current signal into a direct current signal and the alternating current signal in the coupler probe is generated by an alternating current signal in the transition probe.

In accordance with some embodiments, the direct current signal is provided to a microprocessor to modify the alternating current signal in the transition probe.

In accordance with some embodiments, there is no load connected to the coupler probe.

BRIEF DESCRIPTION OF THE DRAWINGS

Different aspects of the present invention as well as features and advantages thereof will be more clearly understood hereinafter because of a detailed description of embodiments of the present invention when taken in conjunction with the accompanying drawings, which are not necessarily drawn to scale. Like reference numerals refer to corresponding parts throughout the several views of the drawings.

DESCRIPTION OF EMBODIMENTS

Reference will now be made in detail to embodiments, examples of which are illustrated in the accompanying drawings. In the following detailed description, numerous non-limiting specific details are set forth in order to assist in understanding the subject matter presented herein. It will be apparent, however, to one of ordinary skill in the art that various alternatives may be used without departing from the scope of the present invention and the subject matter may be practiced without these specific details. For example, it will be apparent to one of ordinary skill in the art that the subject matter presented herein can be implemented on many types of outdoor radios systems.

Figure 1:
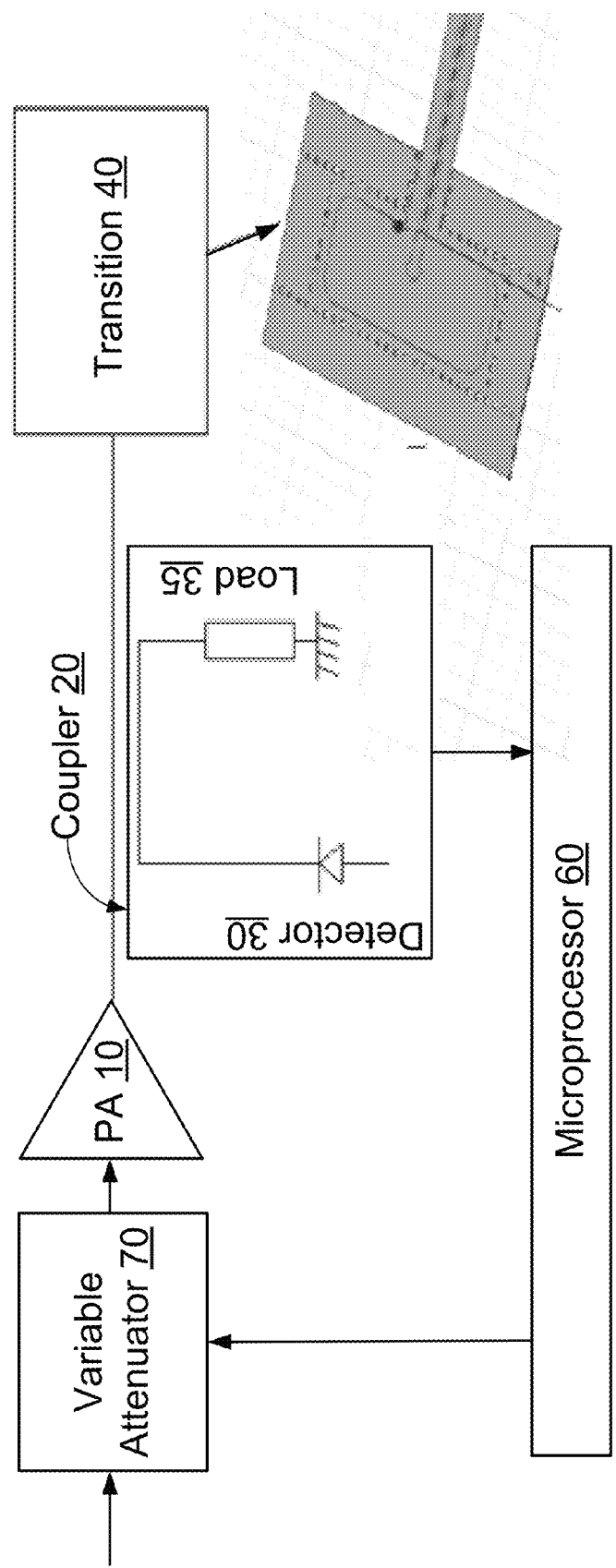
FIG. 1 depicts a conventional power detecting and coupling circuitry design.

FIG. 1 depicts a conventional power detecting and coupling circuitry design that includes a Power Amplifier 10 (PA), a coupler 20, and a transition 40 (e.g., a microstrip-to-waveguide transition shown in the figure). The coupler 20 further includes a detector 30 and a load 35 to detect the output power level of the PA 10. For example, the detector 30 may include a diode to convert an alternating current (AC) signal output by the PA 10 into a direct current (DC) signal, which represents the current power level. A microprocessor 60 compares the DC signal with a predefined power level threshold, which represents a desired power level, and controls a variable attenuator 70 accordingly based on a comparison result of the DC signal and the predefined power level threshold. As such, there is a feedback loop formed between the coupler 20 and the PA 10 to make sure that the power level output by the PA 10 is accurate. In some embodiments, the PA 10 is a variable amplifier such that the microprocessor 60 can control the operation of the PA 10 without the variable attenuator 70.

Because the coupler 20 is located behind the PA 10 and it will divert a portion of the output power of the PA 10 for detection, it is important for the coupler 20 to have a structure of minimum insertion loss to maximize the output power reaching the transition 40. In particular, when the frequency of the output signal of the PA 10 gets higher and higher, it is more difficult to design a matched coupler with a high isolation, low insertion loss and wide bandwidth. In addition, it is also difficult to have a perfect load (e.g., 50 Ohm), which is important in the overall coupler design, at the higher microwave and millimeter wave bands. As a result, the parasitic parameters of the coupler 20 have a more significant impact on the circuitry performance when the frequency gets higher.

Figure 2:
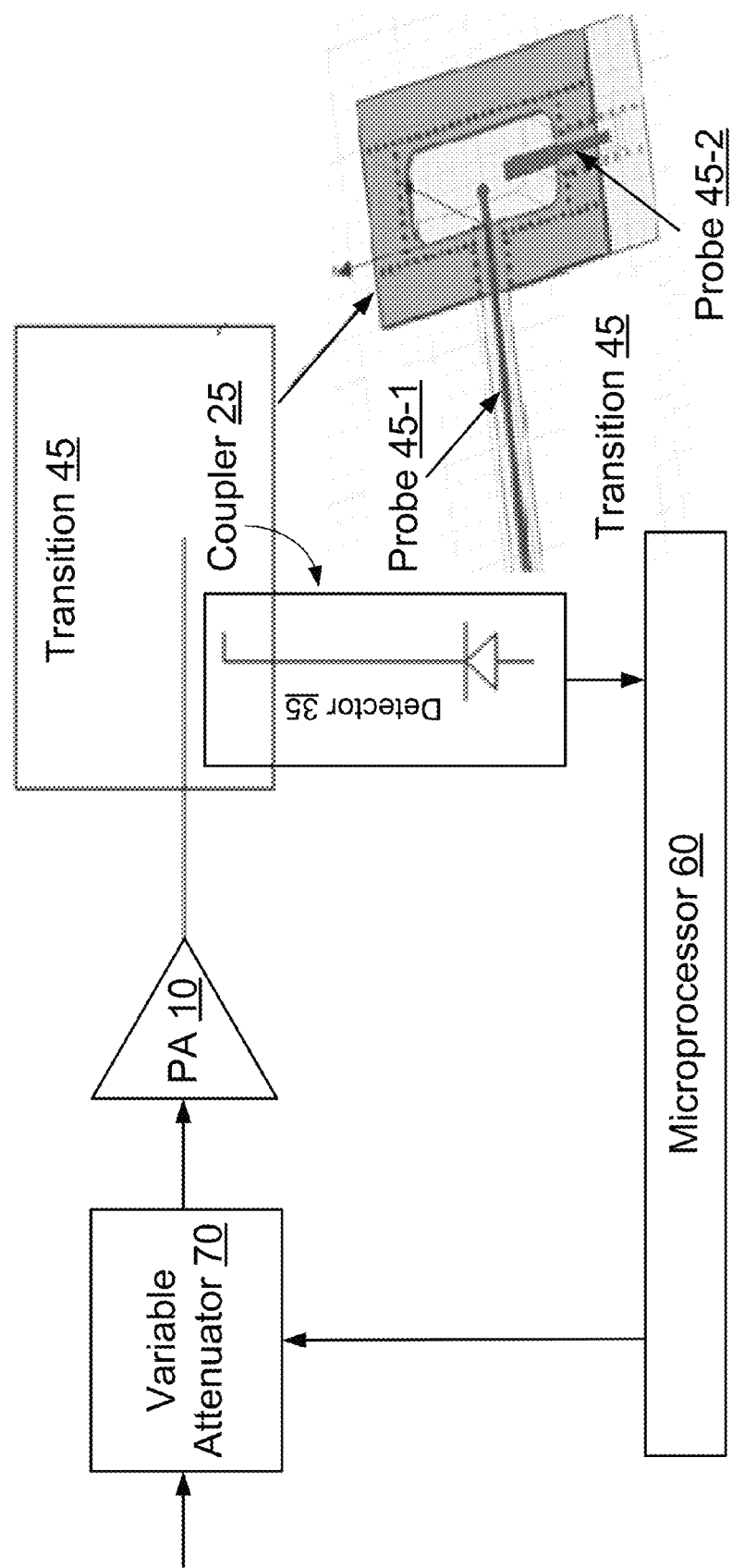
FIG. 2 depicts a power detecting and coupling circuitry design including a compact transition structure in accordance with some embodiments of the present invention.

FIG. 2 depicts a power detecting and coupling circuitry design including a compact transition structure in accordance with some embodiments of the present invention. Compared with the circuitry design in FIG. 1, the coupler 25 is no longer a standalone component between the PA 10 and the transition 45. Rather, the coupler 25 is integrated together with the transition 45 and becomes a part of the transition 45. As shown in FIG. 2, the new transition 45 including an integrated coupler is built on one side of a printed circuit board. There is a rectangular region on the same side of the printed circuit board and the rectangular region has a pair of long edges and a pair of short edges. A transition probe 45-1 is coupled to the PA 50 and it extends into the rectangular region through a long edge of the rectangular region and has a terminal near a center of the rectangular region for introducing the output signal of the PA 10 into the transition 45. The transition probe 45-1 is coupled to an internal of a waveguide (not shown) through an electric field. A coupler probe 45-2 is part of the coupler 25 (e.g., the detector 35 of the coupler 25) and it extends into the rectangular region through a short edge of the rectangular region and has a terminal before the center of the rectangular region. The coupler probe 45-2 is coupled to the internal of the waveguide through electromagnetic fields. Although the coupler probe 45-2 is electrically insulated from the transition probe 45-1 (because the rectangular region on the printed circuit board is not covered with a conductive layer), but it is directly coupling the output signal of the PA 10 from the transition probe 45-1 through the electromagnetic (EM) wave in the transition structure.

Figure 3:
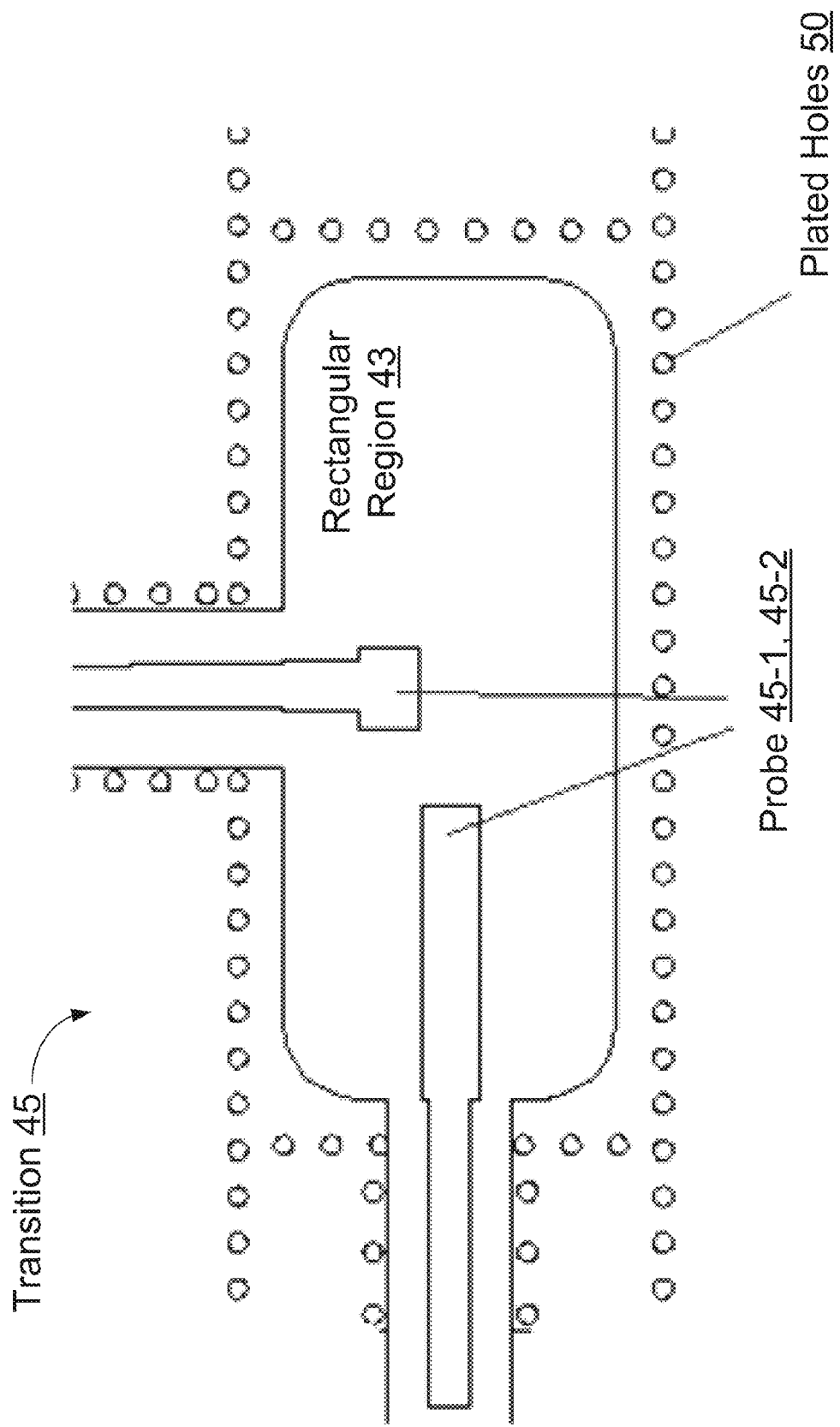
FIG. 3 depicts a first design of the compact transition structure in accordance with some embodiments of the present invention.

FIG. 3 depicts a first design of the compact transition structure in accordance with some embodiments of the present invention. As described above, the two probes 45-1 and 45-2 extend into the rectangular region 43, one serving as a transition probe for introducing the output signal of the PA 10 into the region, which will be fed into a waveguide (not shown), and the other one serving as a coupler probe for detecting the power level of the output signal. Because the coupler is now part of the transition 45, there is no need for a load in the coupler. As such, the physical size of the new transition 45 shown in FIGS. 2 and 3 is smaller than that of a combination of the coupler 20 and the transition 40 as shown in FIG. 1. In addition, there are a plurality of metal-plated through-hole vias 50 surrounding the rectangular region 43, which has four rounded corners, and the two probes 45-1 and 45-2. These metal-plated through-hole vias 50 are electrically connected to a grounded metal layer on the other side of the printed circuit board to protect the two probes from being interfered by external noise or other factors.

Figure 4:
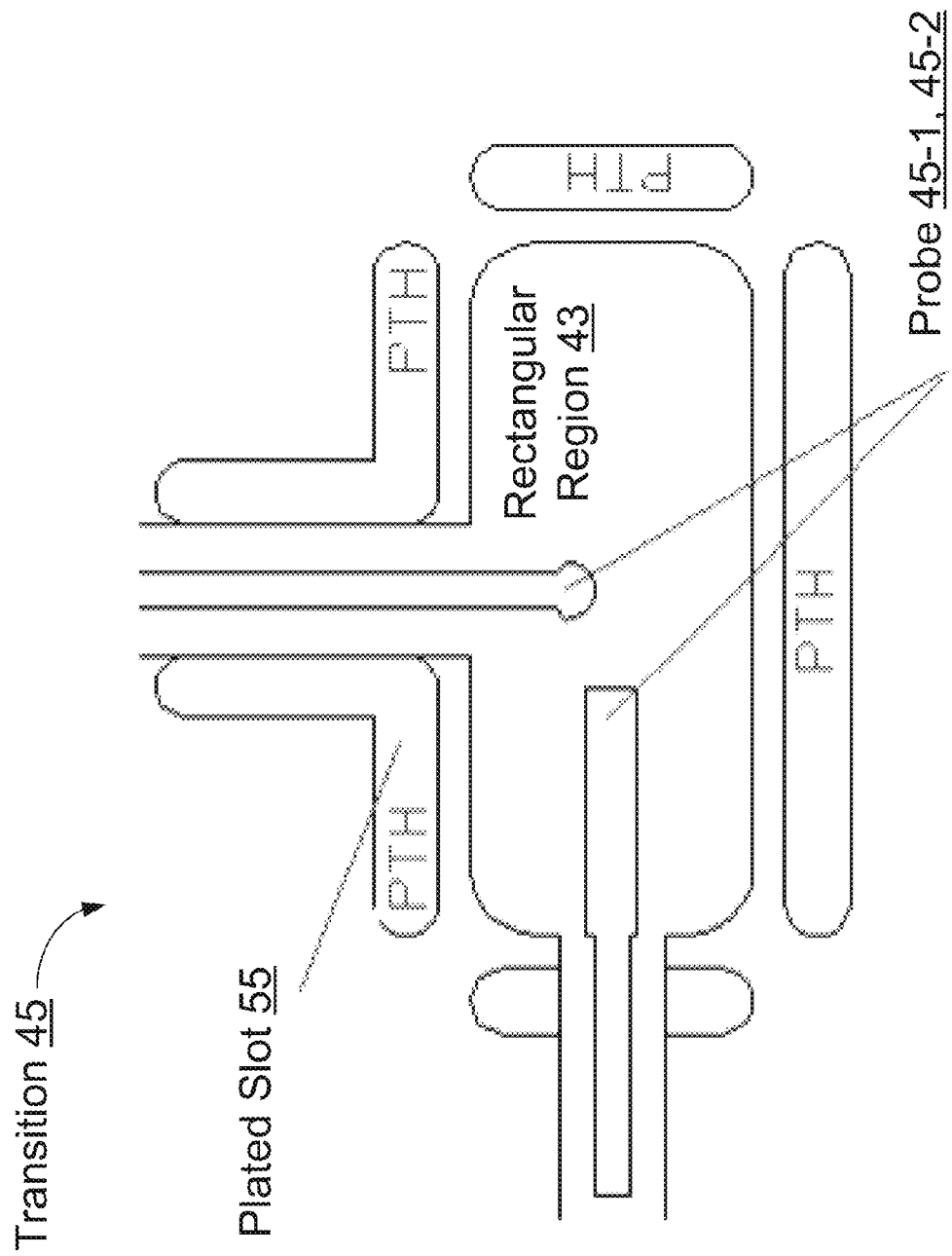
FIG. 4 depicts a second design of the compact transition structure in accordance with some embodiments of the present invention.
Figure 5A:
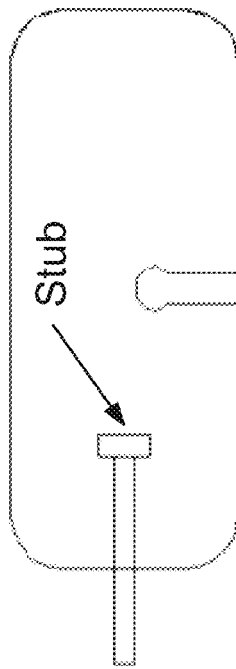
FIGS. 5A to 5D depict four coupler probe designs in accordance with some embodiments of the present invention.
Figure 5B:
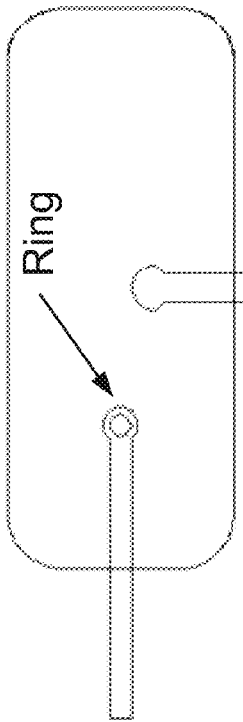
Figure 5C:
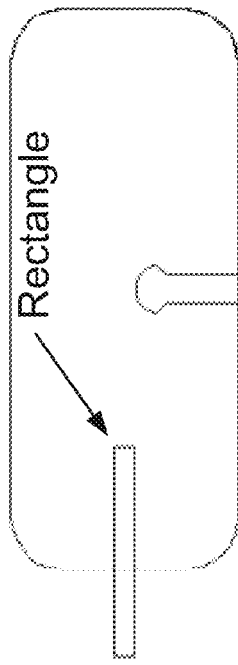
Figure 5D:
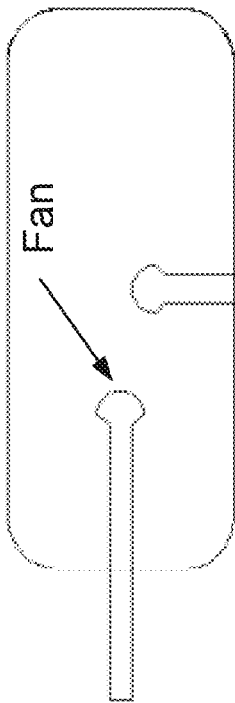

FIG. 4 depicts a second design of the compact transition structure in accordance with some embodiments of the present invention. Like the one shown in FIG. 3, the, the two probes 45-1 and 45-2 extend into the rectangular region 43, one serving as a transition probe for introducing the output signal of the PA 10 into the region and the other one serving as a coupler probe for detecting the power level of the output signal. Because the coupler is now part of the transition 45, there is no need for a load in the coupler. There are a plurality of metal-plated slots 55 surrounding the rectangular region 43 and the two probes 45-1 and 45-2. These metal-plated slots 55 are electrically connected to a grounded metal layer on the other side of the printed circuit board to protect the two probes from being interfered by external noise or other factors. Because of the large area of the metal-plated slots 55, they are more effective in protecting the probes than the metal-plated holes 50 in some applications. With the plated slots, the overall transition shows a better performance with the minimum insertion loss.

The performance of the integrated coupler 25 such as bandwidth, coupling factor and isolation can be optimized by changing the shape, length and location of the coupler probe (also known as "coupling port"). FIGS. 5A to 5D depict four coupler probe layout designs in accordance with some embodiments of the present invention, whose terminal has a shape of rectangle, fan, ring, and stub, respectively. Note that these shapes are for illustrative purposes and the terminal of the coupler probe may have other possible shapes known to those skilled in the art. In some embodiments, the compact transition structure shown in FIGS. 2-5 is based on a multilayer printed circuit board and there are micro-strip and waveguide structure on the multilayer printed circuit board, which may be used in a microwave transmitter to replace the conventional circuitry shown in FIG. 1.

Figure 6:
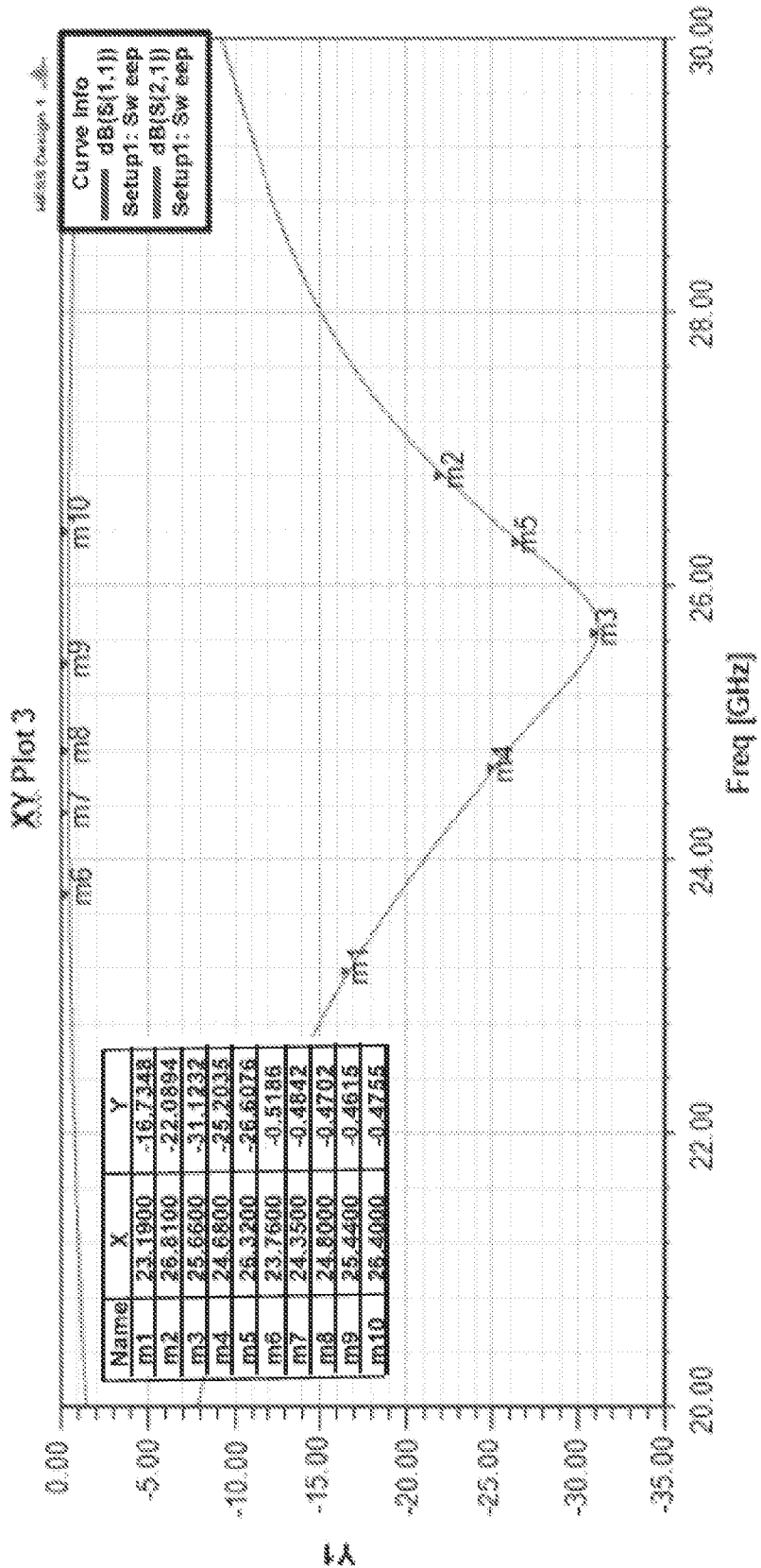
FIGS. 6 and 7 are simulation results of the compact transition structure in accordance with some embodiments of the present invention.
Figure 7:
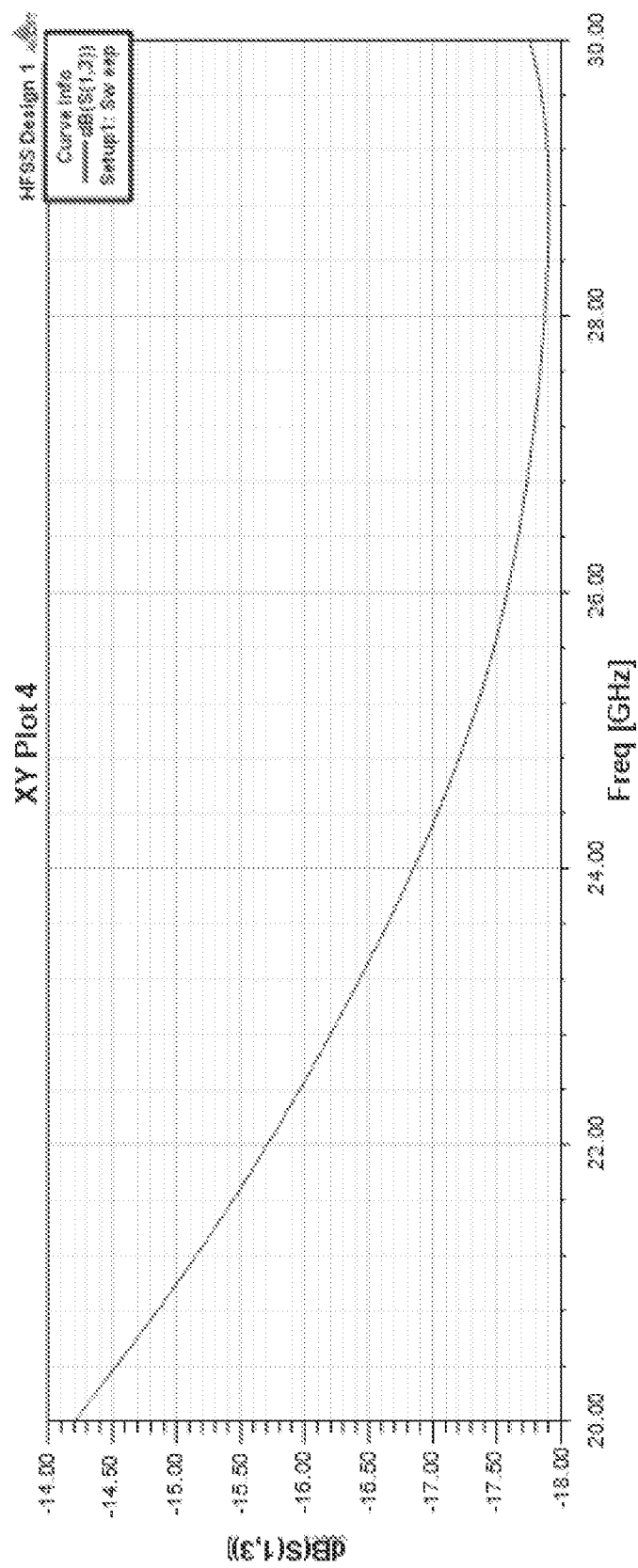

FIGS. 6 and 7 are simulation results of the compact transition structure in accordance with some embodiments of the present invention. As shown in FIGS. 6 and 7, respectively, the transition has a low return loss (−20 dB) while providing a decent coupling factor over a wide frequency bandwidth of wireless telecommunication.

In sum, the compact transition structure with a built-in coupler demonstrates following advantages over the conventional design:

No coupler between the power amplifier and the transition;

No requirement for a perfect load of 50 Ohm for the coupler;

Elimination of the negative impact caused by the parasitic parameters due to the microwave and millimeter band requirement;

Reduced insertion loss of the coupler and therefore improved output power and linearity due to overall low loss of the coupler; and Improved overall layout because of the integration of the coupler into the transition.

The foregoing description, for purpose of explanation, has been described with reference to specific embodiments. However, the illustrative discussions above are not intended to be exhaustive or to limit the invention to the precise forms disclosed. Many modifications and variations are possible in view of the above teachings. The embodiments were chosen and described in order to best explain the principles of the invention and its practical applications, to thereby enable others skilled in the art to best utilize the invention and various embodiments with various modifications as are suited to the particular use contemplated.

We claim:

1. A compact transition structure, comprising:
   a printed circuit board, wherein there is a rectangular region on one side of the printed circuit board and the rectangular region has a pair of long edges and a pair of short edges;
   a transition probe on the one side of the printed circuit board, wherein the transition probe extends into the rectangular region through a long edge of the rectangular region and has a terminal near a center of the rectangular region; and
   a coupler probe on the one side the printed circuit board, wherein the coupler probe extends into the rectangular region through a short edge of the rectangular region and has a terminal before the center of the rectangular region such that the coupler probe is electrically insulated from the transition probe,
   wherein the coupler probe is electrically connected to a diode that converts an alternating current signal into a direct current signal and the alternating current signal in the coupler probe is generated by an alternating current signal in the transition probe and the direct current signal is provided to a microprocessor to modify the alternating current signal in the transition probe.

2. The compact transition structure of claim 1, wherein the terminal of the coupler probe has a shape selected from the group consisting of rectangle, fan, ring, and stub.

3. The compact transition structure of claim 1, wherein the rectangular region on the one side of the printed circuit board is devoid of metal layer.

4. The compact transition structure of claim 1, wherein the rectangular region on the one side of the printed circuit board has four rounded corners.

5. The compact transition structure of claim 1, wherein the rectangular region on the one side of the printed circuit board is surrounded by a plurality of metal-plated through-hole vias.

6. The compact transition structure of claim 1, wherein the rectangular region on the one side of the printed circuit board is surrounded by a plurality of metal-plated slots.

7. The compact transition structure of claim 1, wherein the rectangular region on the one side of the printed circuit board is configured to be coupled to a waveguide.

8. The compact transition structure of claim 7, wherein a return loss between the transition probe and the waveguide is less than −20 dB within a wide microwave frequency range.

9. The compact transition structure of claim 7, wherein the terminal of the transition probe is coupled to an internal of the waveguide through an electric field.

10. The compact transition structure of claim 7, wherein the terminal of the coupler probe is coupled to an internal of the waveguide through a magnetic field.

11. The compact transition structure of claim 1, wherein the transition probe is electrically connected to a power amplifier.

12. The compact transition structure of claim 11, wherein there is no coupler between the transition probe and the power amplifier.

13. The compact transition structure of claim 1, wherein there is no load connected to the coupler probe.

* * * * *